(12) United States Patent
Tomimatsu et al.

(10) Patent No.: US 9,934,940 B2
(45) Date of Patent: Apr. 3, 2018

(54) CONTROL DEVICE, CHARGED PARTICLE BEAM APPARATUS, PROGRAM AND METHOD FOR PRODUCING PROCESSED PRODUCT (71) Applicant: HITACHI HIGH-TECH SCIENCE CORPORATION, Tokyo (JP)

(72) Inventors: Satoshi Tomimatsu, Tokyo (JP); Tsuyoshi Oonishi, Tokyo (JP); Hiroki Kawada, Tokyo (JP); Hideo Sakai, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 0 days.

(21) Appl. No.: 15/468,657

(22) Filed: Mar. 24, 2017

(65) Prior Publication Data

US 2017/0278673 A1 Sep. 28, 2017

(30) Foreign Application Priority Data

Mar. 25, 2016 (JP) ................................. 2016-062280

(51) Int. Cl.
*H01J 37/00* (2006.01)
*H01J 37/302* (2006.01)
*H01J 37/317* (2006.01)

(52) U.S. Cl.
CPC ...... *H01J 37/3026* (2013.01); *H01J 37/3171* (2013.01)

(58) Field of Classification Search
CPC ......................... H01J 37/3026; H01J 37/3171
USPC .................. 250/492.1, 492.2, 492.21, 492.3
See application file for complete search history.

(56) References Cited

U.S. PATENT DOCUMENTS

2014/0061159 A1 3/2014 Asahata et al.

FOREIGN PATENT DOCUMENTS

JP 2001463726 A 4/2014

*Primary Examiner* — Nicole Ippolito
*Assistant Examiner* — Hanway Chang
(74) *Attorney, Agent, or Firm* — Senniger Powers LLP (57) ABSTRACT

There is provided a control device for controlling a charged particle beam apparatus, wherein the beam apparatus comprises a workpiece stage having at least two turning axes which are not parallel to each other and an irradiation unit, and the control device comprises an angle calculation unit that based on a direction of a first processing in which a processed surface having a normal line not parallel to any of the turning axes is generated in the workpiece by the irradiation unit and a direction of a second processing to be processed by the irradiation unit from a direction different from the direction of the first processing with respect to the processed surface to be generated by the first processing, calculates turning angles about the turning axes that changes the direction of the stage from the direction of the first processing to the direction of the second processing.

8 Claims, 10 Drawing Sheets

CONTROL DEVICE, CHARGED PARTICLE BEAM APPARATUS, PROGRAM AND METHOD FOR PRODUCING PROCESSED PRODUCT

CROSS-REFERENCE TO RELATED APPLICATION

This application claims priority from Japanese Patent Application No. 2016-062280, filed on Mar. 25, 2016, the entire subject matter of which is incorporated herein by reference.

BACKGROUND

1. Field of the Invention

The present invention relates to a control device, a charged particle beam apparatus, a program and a method for producing a processed product.

2. Description of Related Art

In the related art, for example, as one approach to analyze the internal structure of a sample such as a semiconductor device and perform stereoscopic observation thereof, a cross section formation processing using a focused ion beam (FIB) (etch processing) is known. In such cross section formation processing, when a structure such as a semiconductor device is exposed on a processed surface of a thin piece sample, since an etching rate of the ion beam varies depending on the structure, a phenomenon, so-called curtain effect in which irregularities are formed on the processed surface and appeared as streaks, sometimes occurs. When this curtain effect occurs, in an observation image of the processed surface, streaks formed by an ion beam processing in addition to an original device structure also appear. Conventionally, a composite charged particle beam apparatus capable of suppressing the curtain effect and acquiring observation images with less streaks formed by the ion beam processing is known (for example, JP-A-2014-063726).

SUMMARY

However, according to JP-A-2014-063726, there is a problem that a formation direction of the processed surface is restricted depending on a direction of a tilt axis of a stage.

The present invention has been made in view of the above circumstances, and an object of the present invention is to provide a control device capable of suppressing the curtaining while alleviating constraints on the formation direction of the processed surface in the ion beam processing, a charged particle beam apparatus, a program, and a method for producing a processed product.

According to an exemplary embodiment of the present invention, there is a control device for controlling a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the control device comprising: an angle calculation unit that based on a direction of a first processing in which a processed surface having a normal line not parallel to any of the turning axes is generated in the workpiece by the irradiation unit and a direction of a second processing to be processed by the irradiation unit from a direction different from the direction of the first processing with respect to the processed surface to be generated by the first processing, calculates turning angles about the turning axes that change the direction of the workpiece stage from the direction of the first processing to the direction of the second processing.

According to one aspect of the exemplary embodiment of the present invention, there is provided the control device for controlling a charged particle beam apparatus, wherein the turning axes include two axes orthogonal to each other at an irradiation position where the charged particle beam of the workpiece stage is irradiated, and the angle calculation unit calculates a turning angle about axis for each of the two axes as the turning angles about the turning axes.

According to one aspect of the exemplary embodiment of the present invention, there is provided the control device for controlling a charged particle beam apparatus, wherein the turning axes are provided with a tilt axis which passes through an irradiation position to be irradiated with the charged particle beam of the workpiece stage and is orthogonal to a direction in which the charged particle beam is irradiated, and a rotation axis which passes through the irradiation position and is orthogonal to the tilt axis, and wherein the angle calculation unit calculates a turning angle about the tilt axis and a turning angle about the rotation axis as the turning angles about the turning axes.

According to one aspect of the exemplary embodiment of the present invention, there is provided the control device for controlling a charged particle beam apparatus, wherein the angle calculation unit calculates a third angle that is the turning angle about the tilt axis as the turning angles about the turning axes, based on a first angle formed by an irradiation axis of the charged particle beam and the rotation axis in the first processing and a second angle indicating a difference between the direction of the first processing and the direction of the second processing.

According to one aspect of the exemplary embodiment of the present invention, there is provided the control device for controlling a charged particle beam apparatus, wherein the angle calculation unit calculates a fourth angle that is a turning angle about the rotation axis as the turning angles about the turning axes, based on the first angle and the third angle.

According to another exemplary embodiment of the present invention, there is provided a charged particle beam apparatus comprising any one of the control devices described above.

According to another exemplary embodiment of the present invention, there is provided a program to be executed in a computer for controlling a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the program configured to execute: a first processing step of generating a processed surface having a normal line not parallel to any of the turning axes in the workpiece, by processing from a first direction, and a second processing step of processing the processed surface generated in the first processing step from a second direction different in direction from the first direction, by rotating the workpiece stage about the turning axis.

According to another exemplary embodiment of the present invention, there is provided a method of producing a processed product by a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the apparatus configured to perform: a first processing step of generating a processed surface having a normal line not parallel to any of the turning axes in the workpiece, by processing from a first direction, and a second processing step of processing the processed surface generated in the first processing step from a second direction different in direction from the first direction, by rotating the workpiece stage about the turning axis.

According to the present invention, the curtaining can be suppressed while alleviating constraints on the direction in which the processed surface of the ion beam processing is formed.

DETAILED DESCRIPTION

Hereinafter, embodiments of the present invention will be described with reference to the drawings. The arrows of the vectors shown in the drawings may be omitted in the following description.

[Configuration of Charged Particle Beam Apparatus 10]

Figure 1:
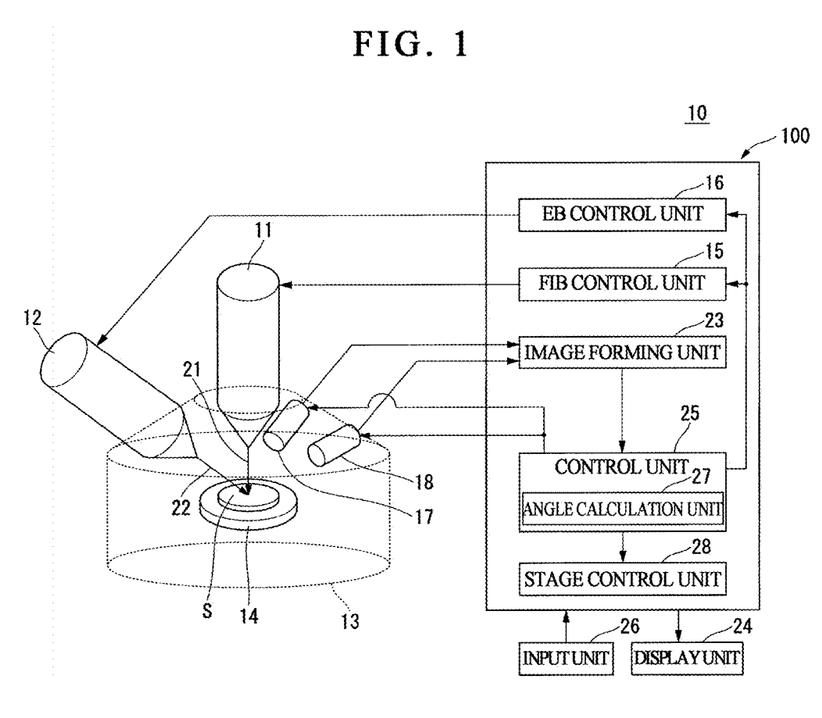
FIG. 1 is a view showing an example of a configuration of a charged particle beam apparatus.

FIG. 1 is a view showing an example of a configuration of a charged particle beam apparatus 10. The charged particle beam apparatus 10 of the present invention includes a focused ion beam (FIB) lens barrel 11, an electron beam (EB) lens barrel 12, and a sample chamber 13.

The focused ion beam lens barrel 11 and the electron beam lens barrel 12 are mounted in the sample chamber 13 and are arranged to enable to irradiate a focused ion beam (FIB) and an electron beam (EB) toward a workpiece S placed on a workpiece stage (sample stage) 14. The focused ion beam lens barrel 11 is also referred to as an irradiation unit. In the focused ion beam lens barrel 11, the scan turning angle can be changed.

The workpiece stage 14 can move, rotate, and tilt in each direction, so that the workpiece S can be adjusted to an arbitrary direction.

Further, it is preferable to provide a reflected electron detector instead of a secondary electron detector 17. The reflected electron detector detects reflected electrons which the electron beam is reflected on the workpiece. By such reflected electrons, a cross-sectional image can be acquired.

The charged particle beam apparatus 10 includes a control device 100. The control device 100 includes a focused ion beam (FIB) control unit 15, an electron beam (EB) control unit 16, an image forming unit 23, a control unit 25, and a stage control unit 28. The focused ion beam controller 15 controls the focused ion beam lens barrel 11 to irradiate the focused ion beam at an arbitrary timing. The electron beam control unit 16 controls the electron beam lens barrel 12 to irradiate the electron beam at an arbitrary timing.

The image forming unit 23 forms an observation image of a cross section of the workpiece S based on the detection results of the secondary electron detector 17 and an EDS detector 18. Specifically, the image forming unit 23 forms an SEM image from a signal for scanning an electron beam 22 and a secondary electron signal detected by the secondary electron detector 17. The image forming unit 23 forms an SIM image based on a signal for scanning a focused ion beam 21 and the secondary electron signal detected by the secondary electron detector 17.

The stage control unit 28 controls an actuator such as a motor that changes an angle of the workpiece stage 14. The angle of the workpiece stage 14 is set according to processing of the workpiece S by the focused ion beam 21, observation of the workpiece S after processing, or the like.

The charged particle beam apparatus 10 further includes a display unit 24 and an input unit 26.

The display unit 24 includes a display device and displays an observation image. The display unit 24 displays the SEM image or the SIM image obtained by the image forming unit 23.

The operator inputs various control conditions of the charged particle beam apparatus 10 via the input unit 26. The input unit 26 transmits the input information to the control unit 25.

The control unit 25 outputs control signals to the ion beam control unit 15, the electron beam control unit 16, the image forming unit 23, and the stage control unit 28, and controls the entire operation of the charged particle beam apparatus 10. Further, the control unit 25 includes an angle calculation unit 27 as its functional unit.

The angle calculation unit 27 calculates the angle of the workpiece stage 14 based on the information input via the input unit 26. The control unit 25 controls the angle of the workpiece stage 14 by outputting a control signal indicating the angle calculated by the angle calculation unit 27 to the stage control unit 28.

Next, the angle of the workpiece stage 14 calculated by the angle calculation unit 27 will be described. First, a coordinate system for explaining the angle of the workpiece stage 14 will be described. This coordinate system has two types of coordinate systems, a stage coordinate system and a scan coordinate system. Hereinafter, the scan coordinate system will be described with reference to FIG. 2, and the stage coordinate system will be described with reference to FIG. 3.

[Scan Coordinate System and Stage Coordinate System]

Figure 2:
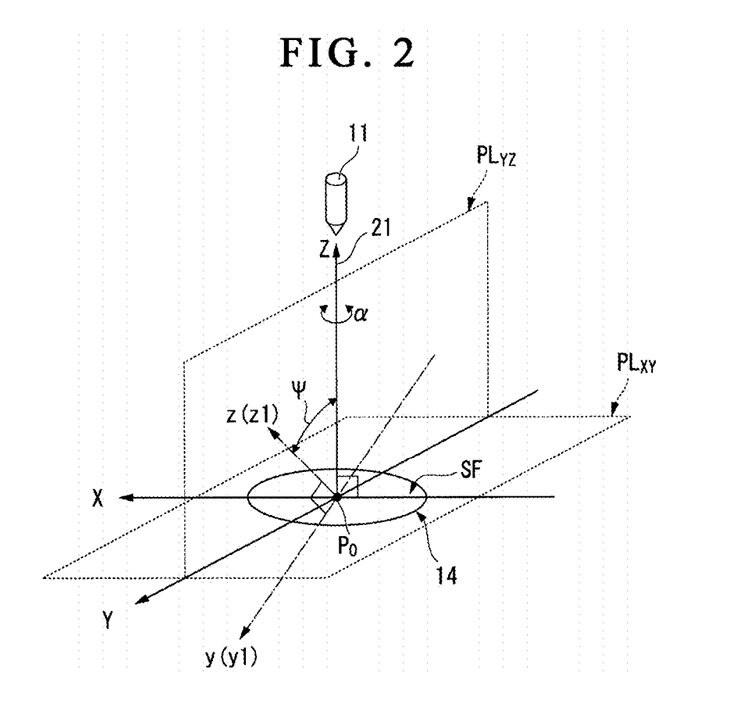
FIG. 2 is a view showing an example of a scan coordinate system of the present embodiment.

FIG. 2 is a view showing an example of the scan coordinate system of the present embodiment. The scan coordinate system is a coordinate system in which a direction of the workpiece S placed on the workpiece stage 14 is indicated by three-axis orthogonal coordinates of X axis, Y axis, and Z axis. The X axis is an axis that coincides with a tilt axis among turning axes of the workpiece stage 14. Hereinafter, an angle about the X axis is also referred to as the tilt angle. The Y axis is an axis parallel to the surface SF of the workpiece S placed on the workpiece stage 14 in a state where the tilt angle is 0 degrees. A plane $PL_{XY}$ formed by the X and Y axes, in the state the tilt angle is 0 degrees, is parallel to the surface SF of the workpiece S.

The Z axis is an axis that coincides with the direction of the focused ion beam 21, that is, the optical axis of the focused ion beam lens barrel 11, and makes positive the direction from the workpiece S to the focused ion beam lens barrel 11. In a state where the tilt angle is 0 degrees, the normal direction of the surface SF of the workpiece S placed on the workpiece stage 14 coincides with the Z axis. The Z axis intersects with the X axis and the Y axis at a point $P_o$ on the surface SF of the workpiece S.

The normal direction of the surface SF, in response to change of the tilt angle of the workpiece stage 14, changes in the plane $PL_{YZ}$. The plane $PL_{YZ}$ is a plane formed by the Y and Z axes. For example, when the tilt angle is the angle Ψ, the normal direction of the surface SF is the direction z1 shown in the same figure. Also, when the tilt angle is the angle Ψ, the surface SF is parallel to the direction y1 shown in the same figure. In order to indicate the direction of the workpiece stage 14, that is, the direction of the surface SF of the workpiece S when the tilt angle is the angle Ψ, a stage coordinate system is used.

Figure 3:
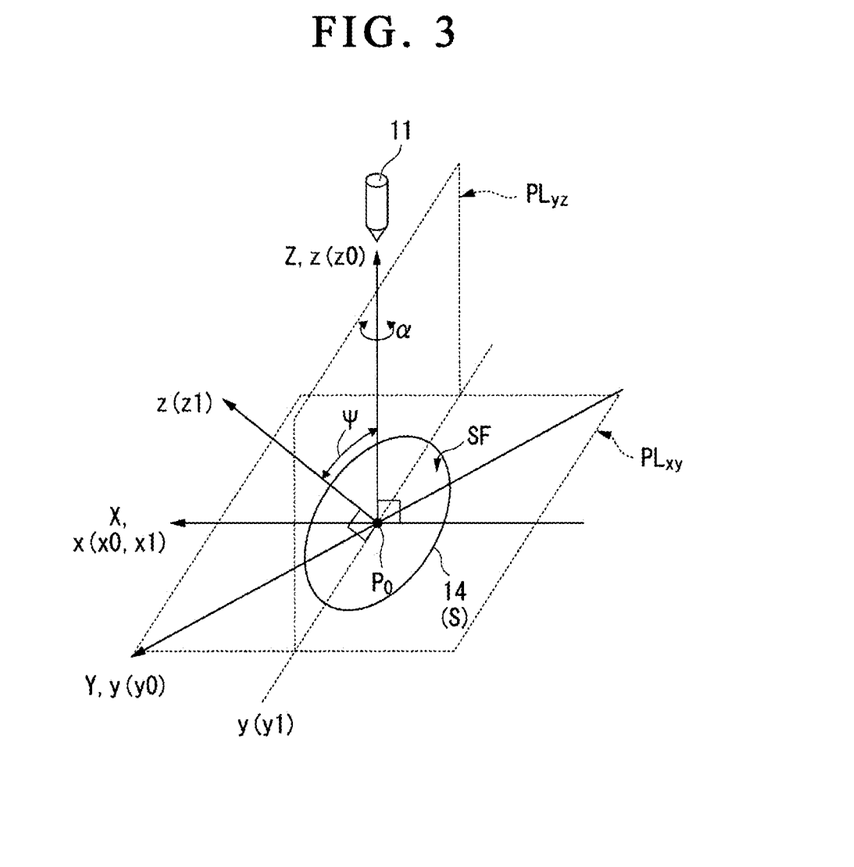
FIG. 3 is a view showing an example of a stage coordinate system according to the present embodiment.

FIG. 3 is a view showing an example of the stage coordinate system of this embodiment. The stage coordinate system is a coordinate system in which a direction of the workpiece S placed on the workpiece stage 14 is indicated by three-axis orthogonal coordinates of x axis, y axis, and z axis. The z axis indicates the normal direction of the surface SF of the workpiece S. That is, z axis, in a plane $PL_{yz}$, indicates a direction inclined by a tilt angle relative to the Z axis (in the example of FIG. 3, the angle Ψ). Further, the z axis is an axis that coincides with a rotation axis among turning axes of the workpiece stage 14. Hereinafter, an angle about the z axis is also described as a rotation angle. The x axis is an axis coinciding with the tilt axis, that is, the X axis. The y axis is an axis parallel to the surface SF of the workpiece S placed on the workpiece stage 14. The y axis creates a right handed system around the right thread of the z axis. A plane $PL_{xy}$ formed by the x axis and y axis is parallel to the surface SF of the workpiece S irrespective of the tilt angle. Incidentally, in the x axis, the case where the tilt angle is 0 degrees is described as x0 axis, and the case where the tilt angle Ψ is described as x1 axis. Also, in the y axis, the case where the tilt angle is 0 degrees is described as the y0 axis, and the case where the tilt angle is Ψ is described as y1 axis. In the z axis, the case where the tilt angle is 0 degrees is described as the z0 axis, and the case of the tilt angle Ψ is described as the z1 axis.

[Regarding Workpiece S and Suppression of Curtaining]

Next, an example of the workpiece S of the present embodiment will be described with reference to FIGS. 4 and 5.

Figure 4:
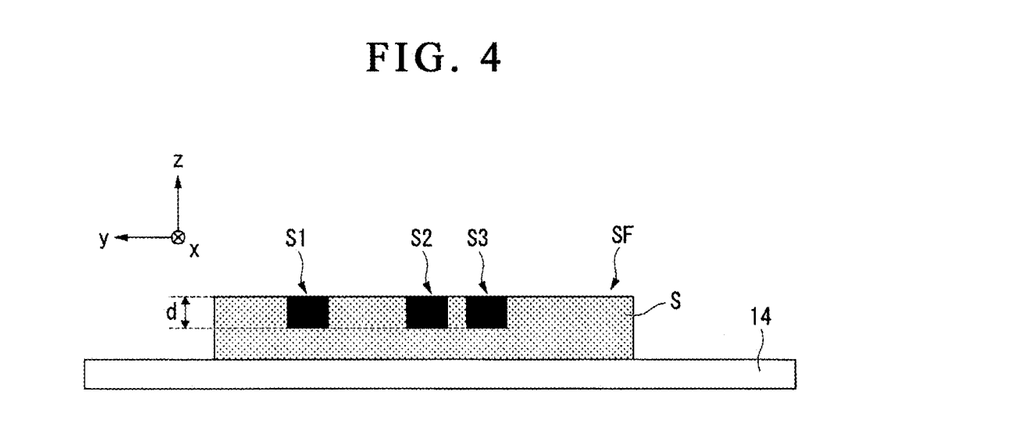
FIG. 4 is a view showing an example of a cross section of a workpiece before processing according to the present embodiment.

FIG. 4 is a view showing an example of a cross section of the workpiece S before processing according to this embodiment.

Figure 5:
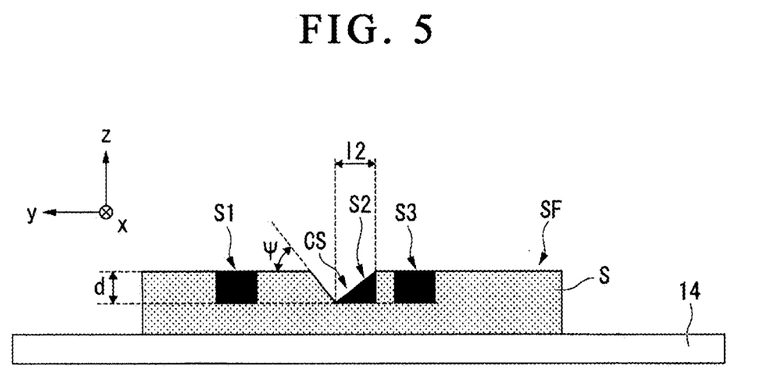
FIG. 5 is a view showing an example of a cross section of the workpiece after processing according to the present embodiment.

FIG. 5 is a view showing an example of a cross section of the workpiece S after processing according to this embodiment.

The workpiece S of the present embodiment is, for example, a semiconductor wafer. On this semiconductor wafer, circuit patterns S1 to S3 are formed. Among the circuit patterns S1 to S3, for example, a case of measuring a thickness d of the circuit pattern S2 will be described. By measuring a length l2 of an inclined cross section of the circuit pattern S2 as viewed from the vertical direction, the thickness d can be obtained based on the measured length l2 and an angle of the inclined cross section (for example, the angle Ψ). Here, the charged particle beam apparatus 10 cuts part of the circuit pattern S2 to form a cross section CS. In this example, the charged particle beam apparatus 10 irradiates the focused ion beam 21 from the focused ion beam lens barrel 11 to the workpiece S in a state where the tilt angle of the workpiece stage 14 is set to the angle Ψ, so that the inclined cross section can be set to the angle Ψ.

In the following description, a processing of changing the shape of the workpiece S by irradiating the focused ion beam 21 on the workpiece S from the focused ion beam lens barrel 11 will also be simply described as a FIB processing.

Here, when the inclined cross section is produced by the FIB processing, streaks affected by the device surface structure of the wafer may be formed in some cases. A phenomenon in which streaks affected by the device surface structure are formed is referred to as curtaining. This curtaining causes deterioration of measurement accuracy. In order to suppress this curtaining, the following method is known. In other words, with respect to the cross section CS generated in the workpiece S by a first FIB processing, from a direction different from the irradiation direction of the focused ion beam 21 by the first FIB processing, a second focused ion beam 21 is irradiated in a second FIB processing. That is, curtaining can be suppressed by irradiating the focused ion beam 21 from a plurality of different directions to the cross section CS.

In order to irradiate the focused ion beam 21 from the plurality of different directions with respect to the cross section CS, it is required to appropriately calculate the turning angle of the tilt axis and the turning angle of the rotation axis of the workpiece stage 14 at the time of shifting from the first processing to the second processing. The procedure of calculating the turning angle of the tilt axis and the turning angle of the rotation axis of the workpiece stage 14 by the angle calculation unit 27 will be described below with reference to FIG. 6 and subsequent figures.

[Procedure of Calculating Turning Angle of Workpiece Stage 14]

Figure 6:
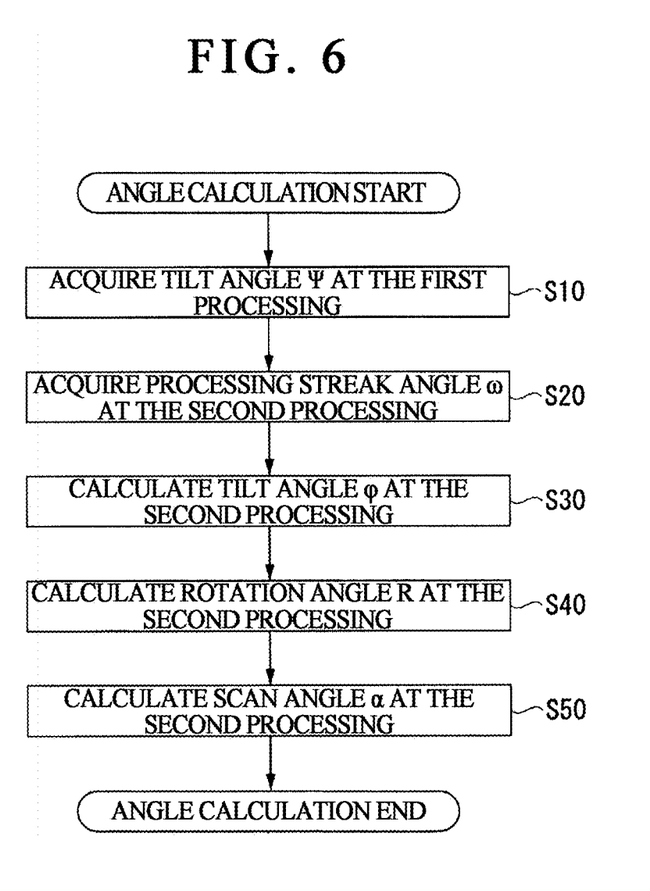
FIG. 6 is a view showing an example of a calculation procedure of a turning angle by an angle calculation unit according to the present embodiment.

FIG. 6 is a view showing an example of the calculation procedure of the turning angle by the angle calculation unit 27 of the present embodiment. In this example, in the first processing, the FIB processing is performed on the workpiece S with the tilt angle set to Ψ and the rotation angle set to 0 degrees. Here, for the sake of simplicity, it is assumed that the rotation angle of the first processing is 0 degrees, but actually the absolute value of the rotation angle is determined by the turning angle of the sample fixed to the stage. Since what is important here is the relative difference between the rotation angles of the first processing and the second processing, even when the rotation angle of the first processing is not 0 degrees, it goes without saying that the angle discussed in the present description can be considered as the relative difference of the rotation angle of the second processing. By the first FIB processing, a cross section CS corresponding to the tilt angle Ψ is generated on the workpiece S. In the second processing, a FIB processing is performed on the cross section CS of the workpiece S from a direction deviated from the direction of the first processing by an angle ω. This angle ω is also described as a processing streak angle ω at the second processing.

The angle calculation unit 27 acquires the tilt angle Ψ at the first processing (step S10). The angle calculating unit 27 acquires the processing streak angle ω at the second processing (step S20). Here, the tilt angle Ψ and the processing streak angle ω are input via the input unit 26, respectively.

Figure 7:
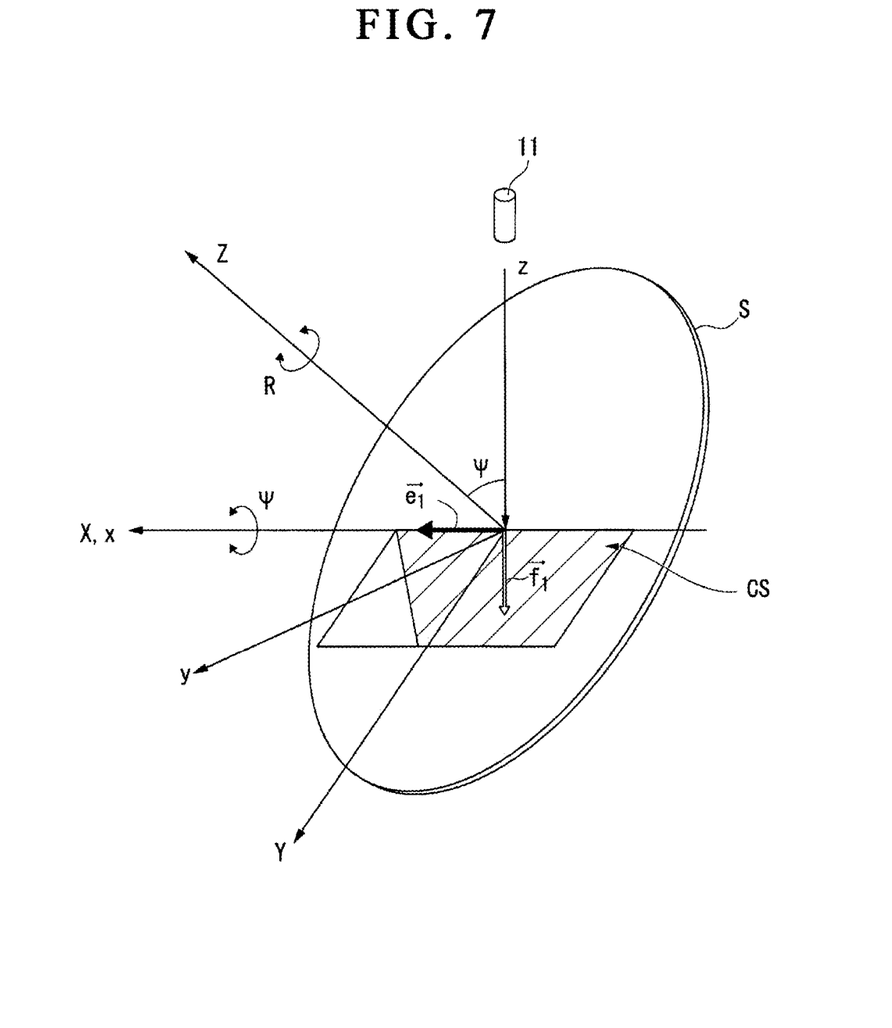
FIG. 7 is a view showing an example of a result of a first FIB processing according to the present embodiment.

FIG. 7 is a view showing an example of a result of the first FIB processing of the present embodiment. As shown in the figure, processing streaks by curtaining are produced in the cross section CS by the FIB processing. The direction vector of the processing streaks by the first FIB processing is assumed to be a direction vector $f_{1T}$. In addition, the direction vector indicating a scan direction of the first FIB processing is assumed to be a direction vector $e_{1T}$. In the following description, the length of the direction vector is assumed to be 1.

Figure 8:
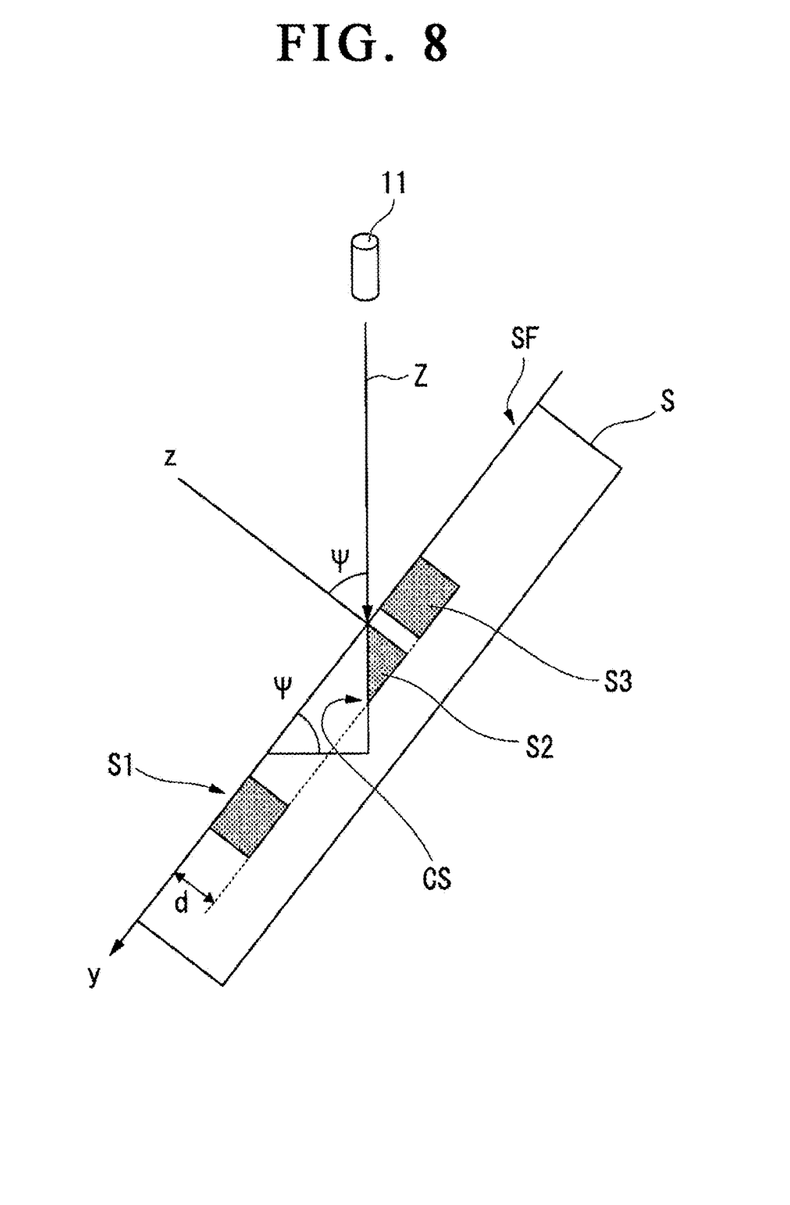
FIG. 8 is a view showing an example of a cross section of the workpiece by a first FIB processing according to the present embodiment.

FIG. 8 is a view showing an example of a cross section of the processing target S by the first FIB processing of the present embodiment. The normal line of the surface SF of the workpiece S coincides with the z axis. Therefore, when the tilt angle of the workpiece stage 14 is the angle Ψ, the direction of the FIB processing, that is, the angle formed by the Z axis and the z axis is the angle Ψ.

Returning to FIG. 7, when the tilt angle of the workpiece stage 14 is the angle Ψ, the following equations (1) and (2) hold.

[Equation 1]

$$\vec{f}1T = (0, \sin\Psi, -\cos\Psi) \quad (1)$$

[Equation 2]

$$\vec{e}1T = (1, 0, 0) \quad (2)$$

Next, the angle calculating unit 27 calculates the tilt angle φ and the rotation angle R at the second processing (Step S30, Step S40). Here, the angle calculation unit 27 calculates the tilt angle φ and the rotation angle R based on the tilt angle Ψ acquired in step S10 and the processed streak angle ω acquired in step S20. A procedure for calculating the tilt angle φ and the rotation angle R by the angle calculation unit 27 will be described.

The angle calculation unit 27 calculates an angle at which the workpiece stage 14 is rotated about the rotation axis after the first FIB processing. A vector (Xr, Yr, Zr) after rotating a vector ($x_1$, $y_1$, $z_1$) before turning for rotation by the angle R is obtained by the well-known equation (3).

[Equation 3]

$$\begin{pmatrix} Xr \\ Yr \\ Zr \end{pmatrix} = \begin{pmatrix} \cos R & -\sin R & 0 \\ \sin R & \cos R & 0 \\ 0 & 0 & 1 \end{pmatrix} \begin{pmatrix} x_1 \\ y_1 \\ z_1 \end{pmatrix} \quad (3)$$

Using this equation (3), a direction vector $f_{1TR}$ and direction vector $e_{1TR}$ after rotating the direction vector $f_{1T}$ and direction vector $e_{1T}$ about the z axis, that is, about the rotation axis respectively by an angle R are shown in equations (4) and (5).

[Equation 4]

$$\vec{f}1TR = \begin{pmatrix} \cos R & -\sin R & 0 \\ \sin R & \cos R & 0 \\ 0 & 0 & 1 \end{pmatrix} \begin{pmatrix} 0 \\ \sin\Psi \\ -\cos\Psi \end{pmatrix} = \begin{pmatrix} -\sin R \cdot \sin\Psi \\ \cos R \cdot \sin\Psi \\ -\cos\Psi \end{pmatrix} \quad (4)$$

[Equation 5]

$$\vec{e}1TR = \begin{pmatrix} \cos R & -\sin R & 0 \\ \sin R & \cos R & 0 \\ 0 & 0 & 1 \end{pmatrix} \begin{pmatrix} 1 \\ 0 \\ 0 \end{pmatrix} = \begin{pmatrix} \cos R \\ \sin R \\ 0 \end{pmatrix} \quad (5)$$

Here, the conversion from the stage coordinate system (x axis, y axis, z axis) to the scan coordinate system (X axis, Y axis, Z axis) is shown in Equation (6).

[Equation 6]

$$\begin{pmatrix} X \\ Y \\ Z \end{pmatrix} = \begin{pmatrix} 1 & 0 & 0 \\ 0 & \cos\phi & \sin\phi \\ 0 & -\sin\phi & \cos\phi \end{pmatrix} \begin{pmatrix} x \\ y \\ z \end{pmatrix} \quad (6)$$

Using this equation (6), the direction vector $f_{1TR}$ and direction vector $e_{1TR}$ by the stage coordinate system are converted to a direction vector $F_{1TR}$ and direction vector $E_{1TR}$ by the scan coordinate system. This conversion process is shown in equations (7) and (8).

[Equation 7]

$$\vec{F}_{1TR}\begin{pmatrix} 1 & 0 & 0 \\ 0 & \cos\phi & \sin\phi \\ 0 & -\sin\phi & \cos\phi \end{pmatrix}\begin{pmatrix} -\sin R \cdot \sin\Psi \\ \cos R \cdot \sin\Psi \\ -\cos\Psi \end{pmatrix} = \begin{pmatrix} -\sin R \sin\Psi \\ \cos R \sin\Psi \cos\phi - \cos\Psi \sin\phi \\ -\cos R \sin\Psi \sin\phi - \cos\Psi \cos\phi \end{pmatrix} \quad (7)$$

[Equation 8]

$$\vec{E}_{1TR}\begin{pmatrix} 1 & 0 & 0 \\ 0 & \cos\phi & \sin\phi \\ 0 & -\sin\phi & \cos\phi \end{pmatrix}\begin{pmatrix} \cos R \\ \sin R \\ 0 \end{pmatrix} = \begin{pmatrix} \cos R \\ \sin R \cos\phi \\ -\sin R \sin\phi \end{pmatrix} \quad (8)$$

Here, a direction of the processing streaks to be caused by curtaining during the second FIB processing is set to be a direction vector $F_2$, and a normal vector perpendicular to the processed surface (i.e., the cross-section CS) is set to be a normal vector $N_2$. In the scan coordinate system, the direction vector $F_2$ is a vector of length 1 towards the negative direction on the Z axis. This direction vector $F_2$ is shown in equation (9).

[Equation 9]

$$\vec{F}_2 = \begin{pmatrix} 0 \\ 0 \\ -1 \end{pmatrix} \quad (9)$$

In the second FIB processing, the scan angle is changed by an angle α. An example of this angle α is shown in FIG. 9.

Figure 9:
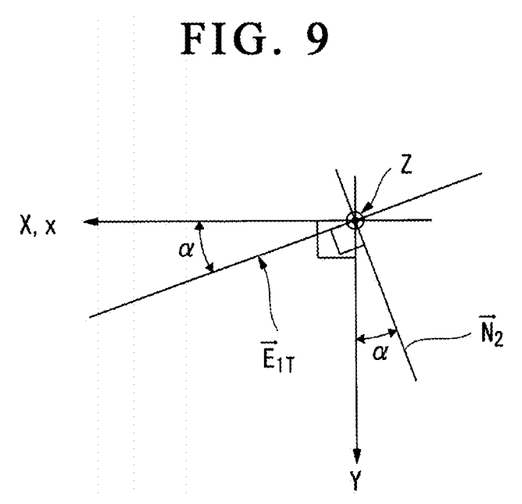
FIG. 9 is a view showing an example of a scan angle according to the present embodiment.

FIG. 9 is a view showing an example of the scan angle α according to this embodiment.

The normal vector $N_2$ is, in the plane $PL_{XY}$, a vector of length 1 that is turned by the angle α from the Y axis. This normal vector $N_2$ is shown in equation (10).

[Equation 10]

$$\vec{N}_2 = \begin{pmatrix} -\sin\alpha \\ \cos\alpha \\ 0 \end{pmatrix} \quad (10)$$

Figure 10:
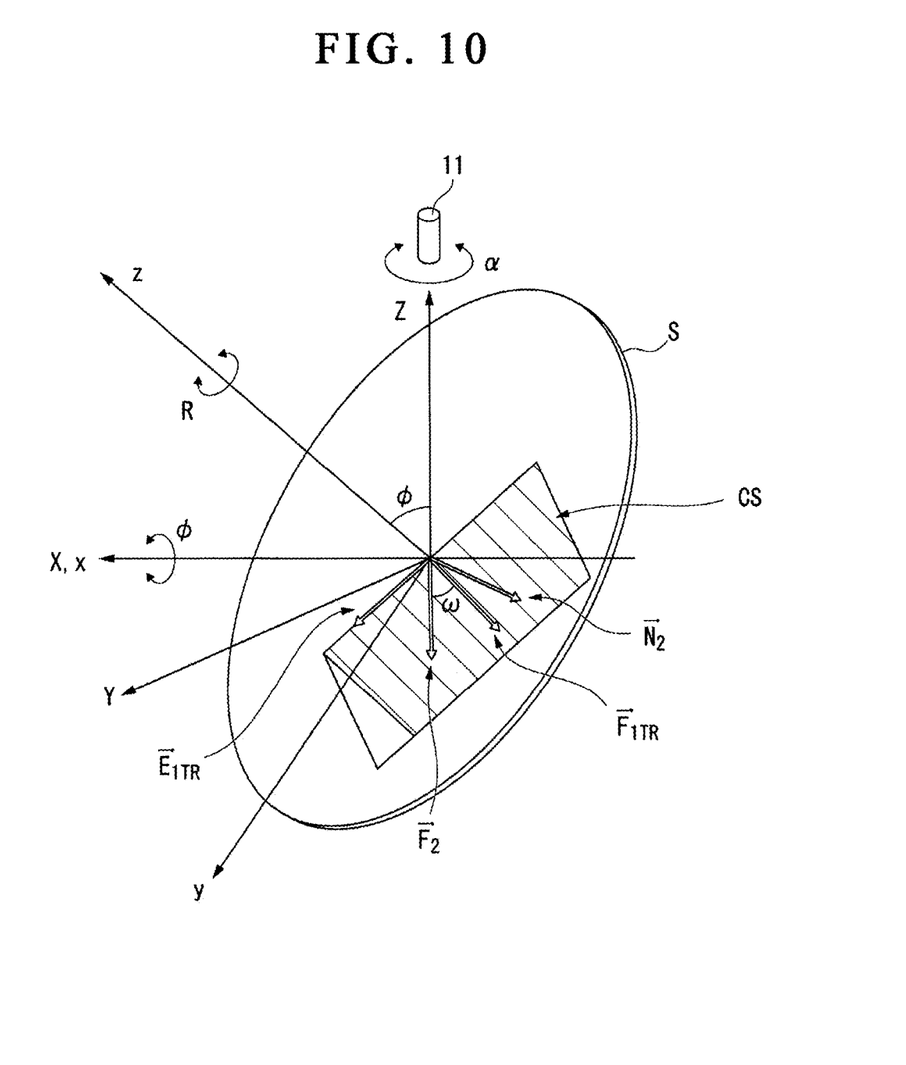
FIG. 10 is a view showing a direction of the workpiece in a second FIB processing according to the present embodiment.

FIG. 10 is a view showing a direction of the workpiece S in the second FIB processing according to the present embodiment.

As shown in FIG. 10, the irradiation direction of the focused ion beam 21 in the second FIB processing is set to be near the elevation angle of 0 degrees with respect to the cross section CS which is the processed surface by the first FIB processing, and is a direction turned by the angle $\omega$ within the plane of the cross section CS. That is, in the second FIB processing, the angle of the workpiece stage 14 is changed so that only the direction of the processing streaks turns by the angle $\omega$ without changing the inclination of the processed surface in the first FIB processing. That is, in the second FIB processing, the following two conditions must be satisfied.

Condition A: The first processed surface (cross section CS) moved by changing the angle of the workpiece stage 14 is oriented in the same direction as the second processed surface.

Condition B: The direction of the first processing streaks and the direction of the second processing streaks form the angle $\omega$.

When expressed using the equations (7) to (10), these conditions are as follows.

In order for condition A to be satisfied, the direction vector $F_{1TR}$ and direction vector $E_{1TR}$ formed by the first FIB processing must be orthogonal to the normal vector N2 of the processed surface by the second FIB processing. This is shown in equations (11) and (12) using the inner product of vectors.

[Equation 11]

$$\vec{N}_2 \cdot \vec{F}_{1TR} = 0 \quad (11)$$

[Equation 12]

$$\vec{N}_2 \cdot \vec{E}_{1TR} = 0 \quad (12)$$

In order for condition B to be satisfied, it is necessary that the inner product of the processing streaks formed by the first FIB processing and the processing streaks formed by the second FIB processing satisfies the condition shown in equation (13).

[Equation 13]

$$\vec{F}_{1TR} \cdot \vec{F}_2 = \cos\omega \quad (13)$$

By solving the simultaneous equations of the equations (11) to (13), it is possible to calculate each parameter when the condition A and the condition B are compatible.

Further, the rotation angle R in the second FIB processing is obtained by equation (14).

[Equation 14]

$$R = \pm\cos^{-1}(\tan\Psi/\tan\varphi) \quad (14)$$

Also, equation (15) is obtained.

[Equation 15]

$$\alpha = \pm\tan^{-1}(\tan R \cdot \cos\varphi) \quad (15)$$

Furthermore, equation (16) is obtained.

[Equation 16]

$$\varphi = \cos^{-1}(\cos\omega \cdot \cos\Psi) \quad (16)$$

That is, the angle calculation unit 27 substitutes the tilt angle $\Psi$ acquired in step S10 and the processing streak angle $\omega$ acquired in step S20 into equation (16), thereby calculating the tilt angle $\varphi$ for the second FIB processing. Further, the angle calculation unit 27 calculates the rotation angle R of the second FIB processing by substituting the tilt angle $\Psi$ acquired in step S10 and the calculated tilt angle $\varphi$ into equation (14). Further, the angle calculation unit 27 calculates the scan angle $\alpha$ by substituting the calculated tilt angle $\varphi$ and rotation angle R into expression (15).

As described above, the charged particle beam apparatus 10 of the present embodiment has the tilt axis and the rotation axis. That is, the charged particle beam apparatus 10 includes the workpiece stage 14 having at least two turning axes which are not parallel to each other. Further, the charged particle beam apparatus 10 includes the irradiation unit for processing the workpiece S on the workpiece stage 14 by irradiating the charged particle beam from a predetermined direction.

The control device 100 of the charged particle beam apparatus 10 calculate the turning angle about the turning axis that changes the direction of the workpiece stage 14 from the first processing direction to the second processing direction based on the first processing direction and the second processing direction. Here, the first processing is a processing in the case where the tilt angle of the workpiece stage 14 is the angle $\Psi$, that is, a processing for a first time. In this first processing, the processed surface (cross section CS) having a normal which is not parallel to any of the turning axes is generated in the workpiece S by the irradiation unit. The second processing is a processing in the case where the tilt angle of the workpiece stage 14 is the angle $\varphi$, that is, a processing for a second time. In this second processing, the processed surface (cross section CS) generated by the first processing is processed by the irradiation unit from a direction different from the direction of the first processing. The control device 100 calculates the tilt angle $\varphi$ and the rotation angle R based on the first processing direction (tilt angle $\Psi$) and the second processing direction (processing streak angle $\omega$).

That is, the control unit 100, based on the direction of the first processing in which the processed surface having a normal which is not parallel to any of the turning axes is generated in the workpiece S by the irradiation unit, and for the processed surface generated by the first processing, the direction of the second processing to be processed by the irradiation unit from the direction different from the direction of the first processing, calculates the turning angle about the turning axis which changes the direction of the workpiece stage 14 from the direction of the first processing to the direction of the second processing.

With this configuration, the control unit 100, if the workpiece stage 14 has two axes of the tilt axis and the rotation axis, in the first FIB processing, even if the direction of the cross section CS has been assumed to be any direction, can suppress the curtaining. Specifically, the control unit 100, in the first FIB processing, even if the direction of the cross section CS has been assumed to be any direction, can calculate an angle which satisfies the above-described conditions A and B as conditions for the second FIB processing.

That is, according to the control unit 100, while alleviating constraints on formation direction of the processed surface of the ion beam processing, it is possible to suppress the curtaining.

Further, the control unit 100, when two axes are orthogonal to each other in an irradiation position to be irradiated by the charged particle beam of the workpiece stage 14 is turning axes, calculates a turning angle about each axis of the two axes as turning angles. If the two axes are orthogonal to each other as the tilt axis and the rotation axis described above, as compared with a case where not orthogonal, a calculation equation of the turning angle is simplified. That is, the control device 100 can calculate the turning angle of the workpiece stage 14 based on the simplified calculation equation.

Further, the angle calculation unit 27 calculates the third angle which is the turning angle about the tilt axis as a turning angle, based on the first angle formed by the irradiation axis of the charged particle beam and the rotation axis in the first processing, and the second angle indicating a difference between the direction of the first processing and the direction of the second processing. In one example described above, the first angle is an angle between the Z axis and the z axis. In other words, the first angle, in one example described above, is the tilt angle $\Psi$. Further, in one example described above, the second angle is the processing streak angle $\omega$. Further, in one example described above, the third angle is the tilt angle $\varphi$. That is, the angle calculation unit 27 calculates the tilt angle $\varphi$, based on the tilt angle $\Psi$ and the processing streak angle $\omega$.

The first angle and the second angle are both input via the input unit 26. According to the angle calculation unit 27, if the operator of the charged particle beam apparatus 10 (operator) inputs the tilt angle $\Psi$ and the processing streak angle $\omega$, the angle calculation unit 27 calculates the tilt angle $\varphi$ of for the second FIB processing. That is, according to the angle calculation unit 27, the angle of the workpiece stage 14 for the second FIB processing can be calculated without depending on manual calculation of the operator. That is, according to the control device 100, it can reduce the need for the operator to calculate the angle of the workpiece stage 14 for processing to reduce curtaining.

Further, the angle calculation unit 27 calculates a fourth angle that is a turning angle about the turning axis as the turning angle, based on the first angle and the third angle. In one example described above, the fourth angle is the rotation angle R. Here, the third angle is calculated by the angle calculation unit 27 based on the first angle and the second angle mentioned above. According to the charged particle beam apparatus 10, if an operator inputs the tilt angle $\Psi$ and the processing streak angle $\omega$, the rotation angle R of the second FIB processing is calculated. That is, according to the angle calculation unit 27, among the angles of the workpiece stage 14 for the second FIB processing, the rotation angle in addition to the tilt angle can be calculated without depending on manual calculation of the operator. That is, according to the control device 100, it can reduce the need for the operator to calculate the angle of the workpiece stage 14 for processing to reduce the curtaining.

It should be noted that the number of times of processing to reduce the curtaining can be arbitrarily selected. For example, also by further performing two times of additional processing with respect to the cross section CS formed by the first FIB processing, it is possible to reduce the curtaining. The angle calculation unit 27, also for a plurality of times of additional processing, can calculate the tilt angle, rotation angle, and scan angle. The processing example of a case in which the charged particle beam apparatus 10 has performed a plurality of times of additional processing is shown in FIG. 11.

Figure 11:
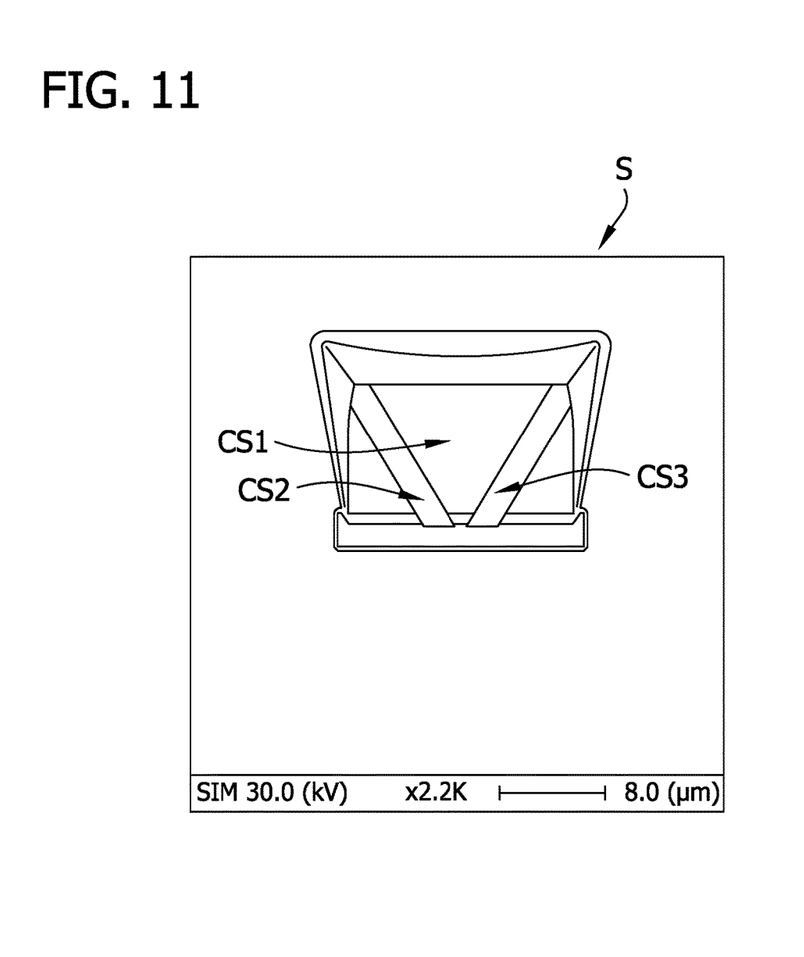
FIG. 11 is a view showing an example of processing by the charged particle beam apparatus according to the present embodiment.

FIG. 11 is a view showing a processing example by the charged particle beam apparatus 10 of the present embodiment. The charged particle beam apparatus 10, with regard to a cross-section CS1 by a first FIB processing of the workpiece S, forms a cross section CS2 by a second FIB processing and a cross section CS3 by a third FIB processing. Thus, the charged particle beam apparatus 10 can suppress the curtaining also by performing only three or more times of FIB processing as well as two times.

Although the embodiments of the present invention have been described in detail with reference to the drawings, specific configurations are not limited to these embodiments, and it can be appropriately modified without departing from the scope of the present invention. Further, without departing from the scope of the present invention, the above-described embodiments can be appropriately combined.

In addition, each of the device and apparatus described above has a computer therein. The procedure of each processing of each of the device and apparatus described above is stored in a computer-readable recording medium in the form of a program. The computer reads out and executes this program, and whereby the above procedures are performed. Here, the computer-readable recording medium may be a magnetic disk, a magneto-optical disk, a CD-ROM, a DVD-ROM, a semiconductor memory or the like. Furthermore, it should be noted that the computer program may be delivered to the computer via a communication line, and the computer which receives this delivery may execute the program.

Further, the program may be one for implementing part of the above functions. Furthermore, it may be a so-called differential file (differential program) in which the above functions can be realized in combination with a program already recorded in a computer system.

LIST OF REFERENCE NUMERALS

10 . . . charged particle beam apparatus
11 . . . focused ion beam barrel
12 . . . electron beam column
13 . . . sample chamber
14 . . . workpiece stage
15 . . . focused ion beam control unit
16 . . . electron beam control unit
17 . . . secondary electron detector
18 . . . EDS detector
100 . . . control device
21 . . . focused ion beam
22 . . . electron beam
23 . . . image forming unit
24 . . . display unit
25 . . . control unit
26 . . . input unit
27 . . . angle calculation unit
28 . . . stage control unit
S workpiece

What is claimed is:

1. A control device for controlling a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the control device comprising:

an angle calculation unit that based on a direction of a first processing in which a processed surface having a normal line not parallel to any of the turning axes is generated in the workpiece by the irradiation unit and a direction of a second processing to be processed by the irradiation unit from a direction different from the direction of the first processing with respect to the processed surface to be generated by the first processing, calculates turning angles about the turning axes that change the direction of the workpiece stage from the direction of the first processing to the direction of the second processing.

2. The control device for controlling a charged particle beam apparatus according to claim 1, wherein
the turning axes include two axes orthogonal to each other at an irradiation position where the charged particle beam of the workpiece stage is irradiated, and
the angle calculation unit calculates a turning angle about axis for each of the two axes as the turning angles about the turning axes.

3. The control device for controlling a charged particle beam apparatus according to claim 2, wherein
the turning axes are provided with a tilt axis which passes through an irradiation position to be irradiated with the charged particle beam of the workpiece stage and is orthogonal to a direction in which the charged particle beam is irradiated, and a rotation axis which passes through the irradiation position and is orthogonal to the tilt axis, and wherein
the angle calculation unit calculates a turning angle about the tilt axis and a turning angle about the rotation axis as the turning angles about the turning axes.

4. The control device for controlling a charged particle beam apparatus according to claim 3, wherein
the angle calculation unit calculates a third angle that is the turning angle about the tilt axis as the turning angles about the turning axes, based on a first angle formed by an irradiation axis of the charged particle beam and the rotation axis in the first processing and a second angle indicating a difference between the direction of the first processing and the direction of the second processing.

5. The control device for controlling a charged particle beam apparatus according to claim 4, wherein
the angle calculation unit calculates a fourth angle that is a turning angle about the rotation axis as the turning angles about the turning axes, based on the first angle and the third angle.

6. A charged particle beam apparatus comprising the control device according to claim 1.

7. A program to be executed in a computer for controlling a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the program configured to execute:
a first processing step of generating a processed surface having a normal line not parallel to any of the turning axes in the workpiece, by processing from a first direction, and
a second processing step of processing the processed surface generated in the first processing step from a second direction different in direction from the first direction, by rotating the workpiece stage about the turning axis.

8. A method of producing a processed product by a charged particle beam apparatus, the charged particle beam apparatus comprising a workpiece stage having at least two turning axes which are not parallel to each other and an irradiation unit for processing a workpiece on the workpiece stage by irradiating a charged particle beam from a predetermined direction, the apparatus configured to perform:
a first processing step of generating a processed surface having a normal line not parallel to any of the turning axes in the workpiece, by processing from a first direction, and
a second processing step of processing the processed surface generated in the first processing step from a second direction different in direction from the first direction, by rotating the workpiece stage about the turning axis.

* * * * *